United States Patent [19]
Gorelik

[11] Patent Number: 5,864,835
[45] Date of Patent: Jan. 26, 1999

[54] APPARATUS FOR SIMULATING A BIOLOGICAL NEURON

[76] Inventor: Vladimir A. Gorelik, 7003 Sand Rd., Wilmington Island, Ga. 31410

[21] Appl. No.: 890,464

[22] Filed: Jul. 9, 1997

Related U.S. Application Data

[60] Provisional application No. 60/041,518 Mar. 24, 1997.
[51] Int. Cl.[6] ...................... G06F 15/18; H01L 21/8232
[52] U.S. Cl. .............................................................. 706/33
[58] Field of Search .............................. 706/33; 257/315; 326/36; 438/257

[56] References Cited

U.S. PATENT DOCUMENTS

| | | | |
|---|---|---|---|
| 5,258,657 | 11/1993 | Shibata et al. | 706/33 |
| 5,263,122 | 11/1993 | Nunally | 706/41 |
| 5,343,555 | 8/1994 | Yayla et al. | 706/33 |
| 5,411,540 | 5/1995 | Edell et al. | 607/53 |
| 5,480,820 | 1/1996 | Roth et al. | 438/257 |
| 5,509,105 | 4/1996 | Roenker et al. | 706/33 |
| 5,537,512 | 7/1996 | Hsia et al. | 706/39 |
| 5,592,589 | 1/1997 | Poon | 706/25 |
| 5,615,305 | 3/1997 | Nunally | 706/35 |
| 5,621,563 | 4/1997 | Boulet et al. | 706/26 |
| 5,627,392 | 5/1997 | Diorio et al. | 257/315 |
| 5,636,327 | 6/1997 | Nakahira et al. | 706/41 |
| 5,640,494 | 6/1997 | Jabri et al. | 706/25 |

OTHER PUBLICATIONS

P. Hasler, et al., "Single Transistor Learning Synapse with Long Term Storage," 1995 IEEE Symp. on Circuits and Systems, vol. 3, pp. 1660–1663, Apr. 1995.

P. Hasler, et al., "Single Transistor Learning Synapses," Advances in Neural Information Processing Systems 7, MIT Press, pp. 817–824, Dec. 1995.

*Primary Examiner*—Robert W. Downs
*Attorney, Agent, or Firm*—Thomas, Kayden, Horstemeyer & Risley

[57] ABSTRACT

An apparatus for simulating the behavior of a biological neuron. In accordance with one aspect of the invention, a charge-carrying component is fabricated from semiconductor material and is disposed above a semiconductor substrate. The charge-carrying component is separated from the substrate, and substantially surrounded, by an isolating material, such as an oxide (e.g., silicon dioxide). Advantageously, the substantial isolation of the component helps ensure the preservation of electrical charge on the charge-carrying component. Indeed, in accordance with a preferred embodiment, virtually no charge leakage occurs, and absent purposeful charge injection or drainage (described below), the charge deposited on the charge carrying component will be preserved for a very long time. In order to control the quantity of charge carried on the charge-carrying component, a charge injector is disposed adjacent to the charge-carrying component and is configured to controllably transfer charge to the charge-carrying component. Similarly, a drain disposed adjacent to the charge-carrying component and configured to controllably transfer charge away from the charge-carrying component. The charge injector and drain of the preferred embodiment of the present invention are structurally similar to charge injectors and drains conventionally used in EEPROM technology. To generate an output, a charge sensor disposed in proximity with a charge sensing location on the charge-carrying component, and an output is provided and disposed in communication with the charge sensor. As a result, the output delivers an electric signal that is indicative of the charge sensed by the charge sensor.

34 Claims, 8 Drawing Sheets

APPARATUS FOR SIMULATING A BIOLOGICAL NEURON

CROSS-REFERENCE TO RELATED APPLICATIONS

This application claims the benefit of U.S. Provisional patent application Ser. No. 60/041,518, filed on Mar. 24, 1997, and entitled New Semiconductor Device and Processing Logic Utilizing Charge Accumulating Properties of a Giant Floating Structure to Simulate the Computational Behavior of a Living Neuron Membrane.

BACKGROUND OF INVENTION

1. Field of the Invention

The present invention generally relates to artificial intelligence systems, and more particularly to an apparatus that simulates a biological neuron for use in artificial intelligence applications.

2. Discussion of the Related Art

As is known, artificial neural networks are made up of multi-dimensional matrices comprising simple computational units generally operating in parallel. These simple computational units are designed to replicate the behavior and interaction of biological neurons, in an effort to mimic the behavior and computational process of the human brain. Such computational process is desirable for achieving things such as extremely fast decisional output, the ability to reason, and the ability to learn.

Many artificial silicon based neural networks have been made. The complexity of these are orders of magnitude less than that of biological nets. State of the art technology simulates neural behavior only in terms of axodendritic connections (discussed further below) and thus is extremely limited. Typically, artificial neural networks try to mimic the human biological network, which allows systems to be trained, as opposed to being programmed. The training techniques create nonlinear statistical models of input data by adjusting the synaptic weight coefficients. These models tend to be more accurate and more sophisticated than the rigid conventional logic of circuit design (or programming techniques) which attempt to model the same behavior.

Artificial neural networks can be implemented in either hardware or in software, depending on the level of performance required. Conventional neural network architectures are often simplistic feed forward or recurrent models, where the timing of events is not important to the processing being done. In biological systems, each synapse has a different size and has size-appropriate capability. Also synapses possess a metabolic rate, whereby if a particular synapse is an often-used-route, it will be more efficient and can communicate more information per unit volume than a synapse which is less frequently used. These qualities are modeled in artificial networks by 'synaptic weight coefficients', which adjust the input signal. Such models, however, generally take into account only the processing of spatial stimuli, and make no provision for temporal processing.

Unfortunately, this further limits the capabilities of the such models, as they fail to achieve the dynamic manner in which information is processed in biological systems. In this regard, the arrangement of neurons in the biological system actually processes very complex signals, not only spatially but temporally as well. Although there has been some research done in artificial systems which theoretically recognize the neuron's temporal qualities, there has been little practical work which utilizes these frequency parameters to control any function within the network.

For example, U.S. Pat. No. 5,615,305 to Nunally discloses an artificial neural network that provides recursive, asynchronous neural processing in a neural processor element, or neuron, which uses a "pulse stream" signaling mechanism that attempts to simulate that of the biological neuron. As acknowledged within the '305 patent, the invention therein advances the state of by providing an asynchronous processor, as opposed to synchronous processors, which impair the ability to achieve a more natural (biological) operation.

However, a shortcoming of the '305 patent, which is common to many prior art devices, relates to the utilization of transistor circuits to realize the processing elements. While the proliferation of semiconductor technology has paved the way for the wide spread use of transistor-based circuits, such circuits have disadvantages when utilized to mimic systems that are inherently analog in nature. This failing is compounded when modeling large scale networks. More particularly, the failing of a transistor model to accurately mimic a biological neuron is compounded when a large number of these transistor circuits are interconnected to simulate a neural network. Thus, the use of transistor-based processing circuits for implementing artificial neural networks creates error-sensitive circuits, wherein an error in one elements may catastrophically compound as it passes through subsequent processing elements.

U.S. Pat. No. 5,537,512 is another example of a largely transistor-based implementation of a neural processing element. The device of the '512 patent utilizes one or more EEPROMS as analog, reprogrammable synapses, which apply weighted inputs to positive and negative term outputs which are combined in a comparator. As noted in the '512 patent, the device therein addresses the need for flexibly configurable neural network elements which can be conveniently and densely packaged while providing wide ranges of programming options, particularly analog programming connections and weights. One of the benefits realized by the device in the '512 patent is the non-volatility of the synaptic weights stored in EEPROMs, as the device need not be reprogrammed before use, which saves time otherwise expended in the overhead of downloading synaptic weighting coefficients.

Notwithstanding the advances realized by the devices of the '305 and '512 patents, and other devices known in the art, the prior art still fails to accurately and adequately model a biological neuron, and therefore artificial neural networks still fail to realize the effectiveness desired. Accordingly, there is still a need to provide a device that more accurately mimics a biological neuron and, therefore, a device that may be interconnected with many similar devices to more accurately model a biological neural network.

SUMMARY OF INVENTION

Accordingly, it is a primary aim of the present invention to provide an apparatus that mimics the behavior of a biological neuron, in such a way that it may controllably and usefully be implemented in artificial neural networks or other intelligence systems.

A more specific object of the present invention is to provide an apparatus that closely resembles the firing activity of a live neuron.

Another object of the present invention to provide a device that mimics both the excitatory and the inhibitory behavior of pre-synaptic potential.

Still another object of the present invention to provide a device with interconnection capabilities resembling the interconnection diversity of neural tissue.

Yet another object of the present invention is to provide a device that minimizes the amount of transistors (or other active components) to achieve a neuron-like behavior in a semiconductor structure.

Other objects, advantages and novel features of the invention will be set forth in part in the description that follows and in part will become apparent to those skilled in the art upon examination of the following or may be learned with the practice of the invention. The objects and advantages of the invention may be realized and obtained by means of the instrumentalities and combinations particularly pointed out in the appended claims.

To achieve the foregoing objects and other novel features, the present invention is generally directed to an apparatus for simulating the behavior of a biological neuron. In accordance with one aspect of the invention, a charge-carrying component is fabricated from semiconductor material and is disposed above a semiconductor substrate. The charge-carrying component is separated from the substrate, and substantially surrounded, by an isolating material, such as an oxide (e.g., silicon dioxide). Advantageously, the substantial isolation of the component helps ensure the preservation of electrical charge on the charge-carrying component. Indeed, in accordance with a preferred embodiment, virtually no charge leakage occurs, and absent purposeful charge injection or drainage (described below), the charge injected on the charge carrying component will be preserved virtually indefinitely (for all practical purposes).

In order to control the quantity of charge carried on the charge-carrying component, a charge injector is disposed adjacent to the charge-carrying component and is configured to controllably transfer charge to the charge-carrying component. Similarly, a drain disposed adjacent to the charge-carrying component and configured to controllably transfer charge away from the charge-carrying component. The charge injector and drain of the preferred embodiment of the present invention are structurally similar to charge injectors and drains conventionally used in EEPROM technology. To generate an output, a charge sensor disposed in proximity with a charge sensing location on the charge-carrying component, and an output is provided and disposed in communication with the charge sensor. As a result, the output delivers an electric signal that is indicative of the charge sensed by the charge sensor.

In the preferred embodiment of the present invention, at least one (and preferably a plurality) excitatory input device is provided. The input device is configured to induce an electric field at a local area of the charge-carrying component, wherein the electric field operates to redistribute charge on the charge-carrying component. This redistribution of charge more closely simulates the continuous analog behavior of a biological neuron. To achieve this redistribution of charge, one embodiment implements the input device as a control electrode disposed in close proximity to the local area. This control electrode is preferably fabricated from metal or a heavily doped polysilicon. In order to controllably impart an electric field to the local area, the control electrode is separated from the charge-carrying component by a gate oxide having a defined thickness. In this way, the magnitude of the electric field induced at the local area is controlled by the combination of the thickness of the gate oxide and the potential of the control electrode. In the preferred embodiment of the present invention, the input from each of the input devices is weighted by a weighting means. As is known, the value of these weighting means may be varied over time to reflect training or learning of the device, and in this way simulate the synaptic weighting that occurs in biological organisms.

The present invention also operates to generate an output signal that closely resembles that generated by a biological neuron, which is a train of pulses. Accordingly, the preferred embodiment of the invention includes a voltage-controlled oscillator electrically disposed between the charge sensor and the output. The voltage-controlled oscillator is configured to deliver a train of electric signal pulses at the output, the train of electrical signal pulses being proportional in frequency to the magnitude of charge sensed by the charge sensor.

In accordance with another novel feature of the present invention, an apparatus is provided for generating a oscillatory output signal having an oscillatory rate that is proportional to the magnitude of charge delivered through the input to the first charge well. The apparatus includes an input disposed to receive an input signal and an output disposed to output an oscillatory signal. A plurality of adjacently-disposed CCD charge wells are disposed between the input and the output. The plurality of CCD charge wells include a first charge well that is disposed in communication with the input and a last charge well is disposed in communication with the output. A charge sensor is disposed in proximity to the first charge well and operates to sense the magnitude of charge stored in the first charge well, and a driver is responsive to the sensor to drive an electrode disposed in proximity to a second charge well, which is disposed adjacent to the first charge well. In operation, the driver is configured to apply a potential to the electrode in response to a signal from the charge sensor indicating a predetermined magnitude of charge is accumulated in the first charge well. In response to the applied potential, the electrode generates an electric field that lowers the energy level of the second charge well below that of the first charge well. As a result, charge will then be passed from the first charge well to the second charge well. To communicate this passage of charge to the output, means are included for propagating the charge delivered to the second charge well to the last charge well. In operation, the sensor, driver, electrode, and means for propagating collectively operate to intermittently transfer charge from the first charge well to the last charge well, and thus the output. This intermittent transfer of charge being realized in a train of output pulses having an oscillatory rate proportional to the magnitude of charge delivered through the input to the first charge well.

In accordance with yet another aspect of the present invention, a method is provided for generating an oscillatory signal. In the preferred embodiment, the method includes the steps of receiving an input signal having a charge magnitude and storing charge from the received input signal in a first charge well of a CCD register. The method then senses the quantity of charge stored in the first charge well and propagates at least a portion of the charge stored in the first charge well to an output, upon sensing a quantity of charge in the first charge well that exceeds a predetermined threshold. Finally, the method inhibits the propagation of charge from the first charge well to the second charge well, when the sensing step indicates that the quantity of charge in the first charge well is less that a predetermined threshold.

BRIEF DESCRIPTION OF THE DRAWINGS

The accompanying drawings incorporated in and forming a part of the specification, illustrate several aspects of the present invention, and together with the description serve to explain the principles of the invention. In the drawings.

DETAILED DESCRIPTION OF THE PREFERRED EMBODIMENT

Having summarized the invention above, reference will now be made in detail to the description of the invention as illustrated in the drawings. While the invention will be described in connection with these drawings, there is no intent to limit the invention to the embodiment or embodiments disclosed therein. On the contrary, the intent is to cover all alternatives, modifications and equivalents included within the spirit and scope of the invention as defined by the appended claims.

Definitions

As previously mentioned, the present invention is directed to a device that artificially simulates a biological neuron, and has particular applications in the developing fields of artificial intelligence ("AI") and artificial neural networks. Therefore, before beginning the description of the illustrated embodiment, a few terms relevant to this technological area will first be defined.

Axon - Is one of two types of extensions or appendages from the cell body of a neuron. Specifically, an axon is the appendage of the neuron that transmits impulses away from the cell body. It is, therefore, properly viewed as an output.

Dendrite - Is the other of the two types of extensions or appendages from the cell body of a neuron. The dendrite is a branching appendage that conducts impulses toward the cell, and is, therefore, properly viewed as an input.

Synapse - A connection between neurons, that forms the principal means of organization.

Synaptic Site - A region where nerve impulses are transmitted and received, encompassing the axon terminal of a neuron that releases neurotransmitters in response to an impulse. It is an extremely small gap across which the neurotransmitters travel, and the adjacent membrane of an axon, dendrite, or muscle or gland cell with the appropriate receptor molecules for picking up the neurotransmitters.

General Background on Neural Networks

As generally discussed previosly, there has been an increasing interest to simulate, in artificial systems, behavior which is normally associated with intelligent activities. In this regard, Artificial Intelligence and Artificial Neural Networks are now rapidly expanding fields of science. These fields are directed to the modeling of neural systems/networks, in order to simulate the "human" processing of data. Desirable characteristics of such systems include decisional speed, the ability to make reasoned decisions, and, perhaps most importantly, the ability to learn for the outcome of past decisions. Thus far, perhaps the largest "road block" in developing artificial neural networks, is the lack of complete understanding of human biological science and therefore the inability to accurately and realistically model human biological systems.

The basic building block is the neuron. A neural network can be described as multi-layered interrelated or interactive sets of neurons. In simple terms, the neuron is composed of a cell body with dendrites branching out away from the main nucleus and an axon (the neuron's main output connector) emerging from the cell body generally in the direction opposite the dendrites. The entire neuron surface (cell membrane), except for the sheathed axon, is cover with synaptic sites. Both the input and output of a neuron is by way of synapses. The input is generally through synaptic connections on the dendrites or the cell body, while the output is generally through the axon, which terminates in synapses. (Although, in some cases the output may be through dendrites via synaptic connections.) In this way neurons communicate via a number of possible synaptic arrangements.

Neuron to neuron communication may occur in the form of: (1) presynaptic membrane (transmitter) to postsynaptic membrane (receiver); (2) axon to dendrite (Axodendritic); (3) dendrite to dendrite (Dendrodendritic); or (4) axon to axon (Axoaxonic). A reciprocal synapse is formed when two dendrites communicate with each other in both directions. Higher order arrangements also exist involving more than two participating neurons. The present invention uses a non standard physical structure to provide more flexibility in building neural networks. As will be appreciated from the discussion that follows, the present invention allows axodendritic, dendrodendritic, axoaxonic, and reciprocal synaptic arrangements. Thus, the potential interconnection capability of the network is immense.

The present invention is a novel semiconductor structure that provides a device capable of exhibiting the behavior that more closely simulates the dynamics (both spatial and temporal) and behavior of a live neuron.

Illustrated Embodiment

Figure 1:
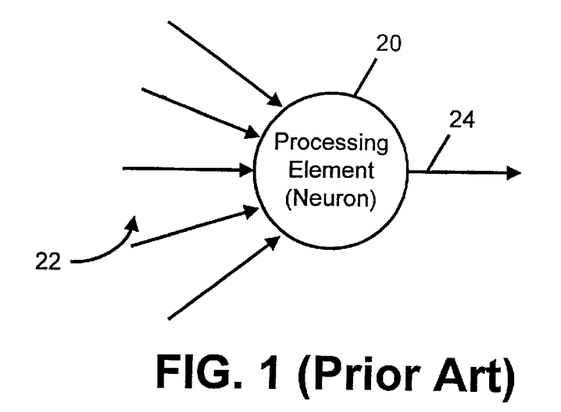
FIG. 1 is a diagram of a processing element illustrating the multi-input, single output characteristics of a biological neuron.

Turning now to the drawings, reference is made to FIG. 1, which is a diagram of a processing element, generally designated by reference numeral 20. The processing element 20 particularly illustrates the multi-input, single output characteristics of a biological neuron, as is known in the prior art. As is known, the processing element 20 is that portion of a neural network in which all the computing is performed. Generally, and as is illustrated, a processing element 20 has a number of inputs 22 and only one output 24. The inputs 22 simulate biological dendrites, while the output 24 simulates a biological axon. However, in some situations, a processing element 20 may have one input connection, as is the case when a processing element 20 is an input-layer processing element, and it receives only one value from the corresponding component of the input pattern.

In practice, there are two general characteristics that a processing element 20 will possess. First, a processing element requires only local information. That is, any and all information that is needed for a processing element 20 to produce its output value 24 is delivered by inputs 22. No other information about other values in the network is required. It will be appreciated that this characteristic is similar to that of a biological neuron. Biological neurons process information that is received by way of dendrite connections output from axons of neighboring neurons. The second characteristic common to most processing elements 20 is that they generate only one output 24. Again, this simulates the behavior of a biological neuron, which has a single, output axon. The value output 24 is either propagated downstream to neighboring neurons, or it will serve as an output 34 from the network 30 (See FIG. 2).

Together, these two qualities allow individual processing elements to process their respective inputs independently of other processing elements, and thus allow neural networks to operate in parallel. As is known, processing elements 20 function to compute an output 24 based upon the values of the various inputs 22, as further affected by a plurality of weighting functions (discussed further below). The weighting functions perform synaptic weighting, neural networks are trained (simulated learning) over time by adjusting the value of the various weighting functions in a manner that is similar to the way a biological neuron will adjust its synaptic weighting as that neuron repeatedly processes input data over time (e.g., as a human learns from experiences).

Since such weighting computations and adjustments are generally known, and since they do not directly impact the present invention, they will not be discussed herein. Suffice it to say that a device constructed in accordance with the present invention will preferably utilize weighting functions, as illustrated hereinafter, to realize behavior that closely resembles that of a biological neuron.

Figure 2:
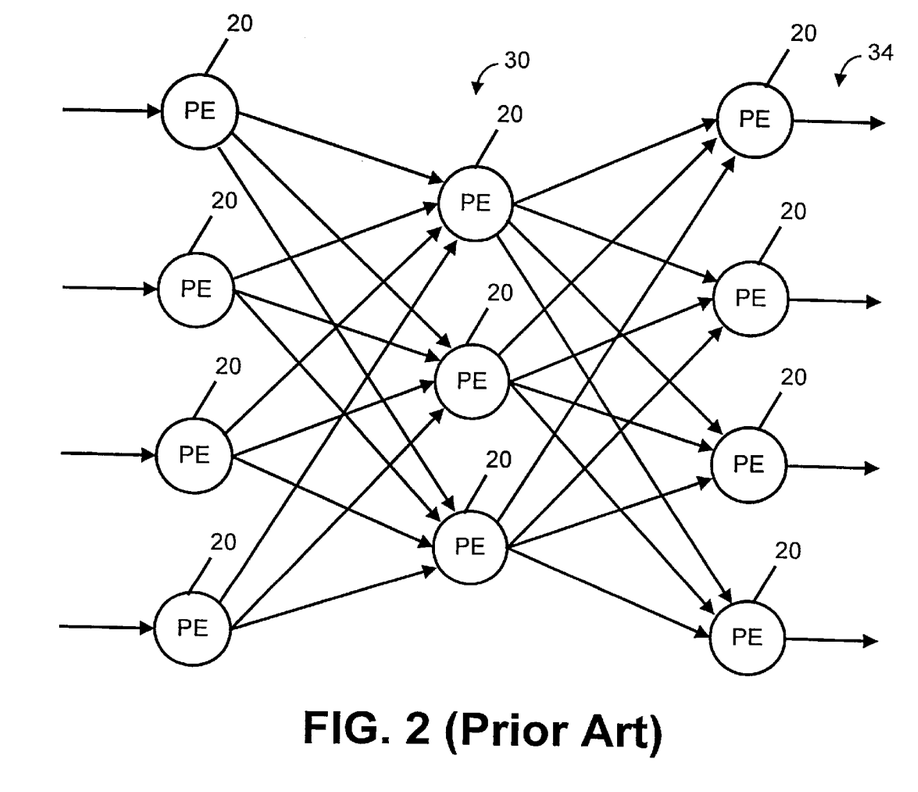
FIG. 2 is a diagram illustrating the interconnection of multiple processing elements, of the type illustrated in FIG. 1, as is known to form artificial neural networks.

To illustrate the manner that individual processing elements 20 are commonly interconnected, in order to construct artificial neural networks, reference is now made to FIG. 2. The diagram of FIG. 2 is an extremely simplified interconnection of processing elements 20 to construct a network 30 that illustrates the structure of artificial neural networks, as in known in the prior art. In this regard, artificial neural networks include a plurality of processing elements 20 and weighted connections (not shown in FIG. 2). Typical neural networks may comprise multiple layers, wherein each layer consists of a collection of processing elements 20. The network 20 of FIG. 2 illustrates three layers.

Each processing element 20 in a neural network generally operates to collect the values from all of its input connections (e.g., dendrites), and performs a predefined mathematical operation to produce a single output. Typically, in artificial neural networks, this mathematical operation is a dot product function. As illustrated, there is generally a weighted connection from every processing element 20 of one layer, to every processing element 20 of the next layer.

As is generally known in the art, the connection weights store the information. The value of the connection weight may sometimes be predefined, and fixed, but usually will be modifiable as the network 30 learns from prior processing. In this way, an artificial neural network 30 models the learning pattern of synaptic weighting of a biological neuron. Indeed, by performing the update operations for each of the processing elements 20, the neural network is able to recall information.

There are several significant features illustrated in the network 30 of FIG. 2, that universally apply to neural networks. First, and as previously described, each processing-element 20 acts and processes its input data 22 independently of all other processing elements 20. In this way, the output of each processing element depends only on the available inputs from the abutting connections. Second, each processing element needs only that information that is provided by the adjoining connections, to perform its mathematical computation. Processing elements 20 do not need to know the state of any of the other processing element, to which it does not have an explicit connection. Thirdly, the usually large number of interconnections provides redundancy that readily accommodates a distributed representation.

The first two features mentioned above allow neural networks to operate efficiently in parallel. The last feature provides neural networks with a strong degree of fault-tolerance. It also provides generalization qualities that are usually very difficult to obtain from typical computing systems.

In a neural network, information flows in only one direction (the direction denoted by the arrows). The representative flow of information through the illustrated network 30 is similar to that of directional graphs. However, neural networks generally extend the directional graph representation to include a weight with each connection that modulates the amount of output signal passed from one processing element 20 down the connection to the adjacent processing element 20.

A connection generally serves to define the information flow through the network and modulate the amount of information passing between processing elements 20. Connection weights may be adjusted during a learning process that captures information. Connection weights that are positive-valued are said to be "excitatory" connections, while those with negative values are called "inhibitory" connections. Accordingly, if a connection weight has a zero value, it is the same as having no connection at all. In this way, all processing elements of one layer may have a connection to all processing elements of the next, succeeding layer. If a given connection is not needed, its weighting value may simply be assigned a zero value.

Figure 3A:
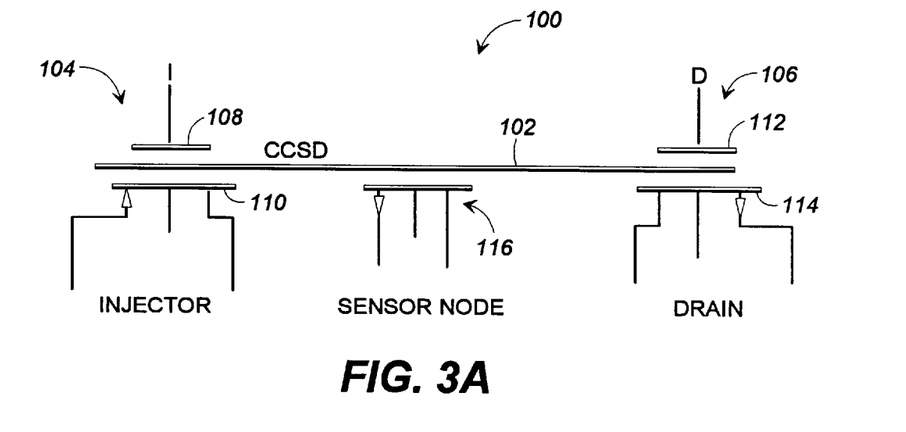
FIG. 3A is a schematic of a charge-carrying structure constructed in accordance with the present invention.
Figure 3B:
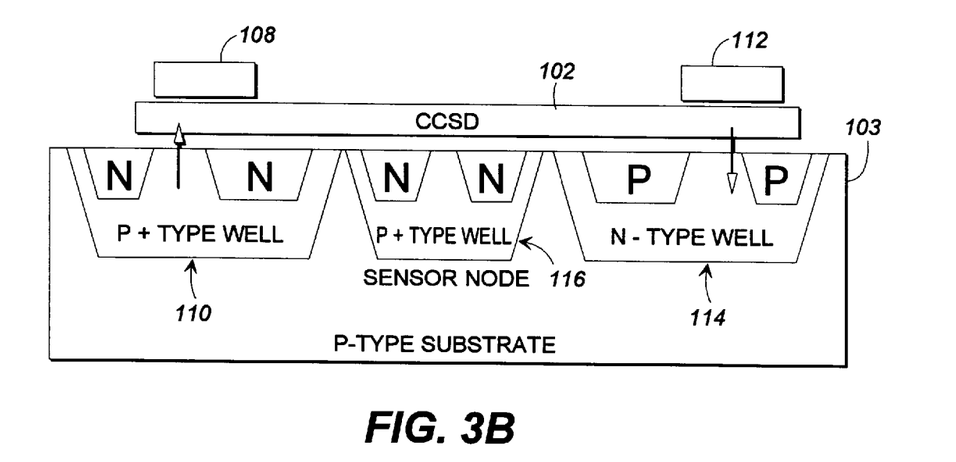
FIG. 3B is a cross-sectional representation of a semiconductor structure for implementing the device schematically represented in FIG. 3A.

Having now described some fundamentals of artificial neural networks that are known in the prior art, reference is now made to FIGS. 3A and 3B, which illustrate the principal components of semiconductor device (generally designated as reference numeral 100) that simulates a biological neuron. FIG. 3A is a diagram that schematically illustrates the device 100, while FIG. 3B is a diagram that illustrates a cross-sectional representation of a semiconductor material. In accordance with the preferred embodiment of the present invention, a charge-carrying semiconductor device (CCSD) 102 is fabricated from semiconductor material (such as a polysilicon) and is disposed above a semiconductor substrate 103, for example a P-type substrate. The charge-carrying semiconductor device 102 is separated from the substrate 103, and substantially surrounded, by an isolating material, such as an oxide. Silicon dioxide ($SiO_2$) or silicon nitride ($Si_3N_4$) are examples of oxides commonly used for this purpose. Advantageously, the substantial isolation of the CCSD 102 helps ensure the preservation of electrical charge on the CCSD 102. Indeed, in accordance with a preferred embodiment, virtually no charge leakage occurs, and absent purposeful charge injection or drainage (described below), the charge deposited on the charge carrying component will be preserved virtually indefinitely (for all practical purposes).

Indeed, the operation of device 100 is based on the ability of free charge to be preserved within the structure for a very long time. Free charge carriers can be introduced by either doping or from external sources. Charge can be introduced via hot electron injection through a thin tunneling-oxide into the CCSD 102 or removed by electron tunneling from the structure to the underlying substrate 103. These two processes can be controlled by applying appropriate potentials to gates 108 and 112 located above the injector 1 10 and drain 114 nodes respectively. These nodes can be formed by conventional MOS transistors or by other means such as a single-transistor silicon synapse. Once charge is resident on the CCSD 102 it will disperse evenly throughout the CCSD 102.

Various electrodes and gates, such as gates 108 and 112, will be referred to herein as being displaced adjacent to or in proximity with the CCSD 102. It will be appreciated that the terms 'adjacent' and 'proximity', are relative terms that necessarily depend upon the operation performed thereby. For example, in regard to the charge injector 104, the gates are spaced from the CCSD 102 by an oxide layer, which is thin enough to permit the transfer of charge carriers (either P-type or N-type) from the well 110 to the CCSD 102, in response to potential applied to the control gate 108.

To more particularly describe the injection and removal of charge to/from the CCSD 102, in order to control the quantity of charge carried on the charge-carrying component, a charge injector 104 is disposed adjacent to the CCSD 102 and is configured to controllably transfer charge to the CCSD 102 from an external source (not shown). Similarly, a drain 106 disposed adjacent to the CCSD 102 and is configured to controllably transfer charge away from the CCSD 102. The charge injector 104 and drain 106 of the preferred embodiment of the present invention are structurally similar to charge injectors and drains conventionally used in EEPROM technology.

The charge injector 104 includes a control gate 108 and a transistor 110, such as a MOSFET, disposed opposite the CCSD 102. The transistor 110 may be formed from a P-type well, with N-type material implanted, as illustrated in FIG. 3B. Applying an appropriate potential to the control gate 108 causes the transistor 110 to transfer charge (through hot electron injection) through the oxide layer surrounding the CCSD 102, to the CCSD. Similarly, a second control gate 112 is disposed in connection with the drain 106, wherein the application of a control potential to the control gate 112 control the operation of a drain transistor 114. Thus, through tunneling or otherwise, this causes charge accumulated and carried on the CCSD to be transferred away, by way of the drain transistor 114. The drain transistor 114 may be formed by an N-type well, with P-type materials implanted therein, as illustrated. Again, the basic structure and operation relating to the charge injection and charge drainage to/from the CCSD 102 is similar to that utilized in EEPROM technology, and for that reason it need not be further described herein.

To generate an output (simulating an axon), a charge sensor 116 disposed in proximity with a charge sensing location on the CCSD, and an output is provided and disposed in communication with the charge sensor. In practice, the charge sensor 116 may be implemented as a transistor that is responsive to charge concentrated in the charge sensing location. In this regard, the charge sensing location will operate much like the control gate 108 and 112 in operating transistors 110 and 114. As a result, the output delivers an electric signal that is indicative of the charge sensed by the charge sensor 116.

Although the structure, technology, and fabrication techniques of the CCSD 102, the charge injector 104 and the drain 106 of the preferred embodiment are similar to those implemented EEPROM devices, the relative size of the CCSD 102, in comparison to surrounding devices (which will be discussed below) is much larger than the relative size proportion of an EEPROM. As will be more fully appreciated from the discussion that follows, the relatively large size of the CCSD 102 allows for controlled redistribution of the charge carried by the CCSD 102, in response to localized electric fields created by input devices, which simulate the input stimulus of synapses and synaptic sites of a biological neuron. Thus, the redistribution of electric charge carried on the CCSD 102 will necessarily effect the concentration of charge in the charge sensing location, and thus the output generated by the charge sensing node 116.

Figure 4:
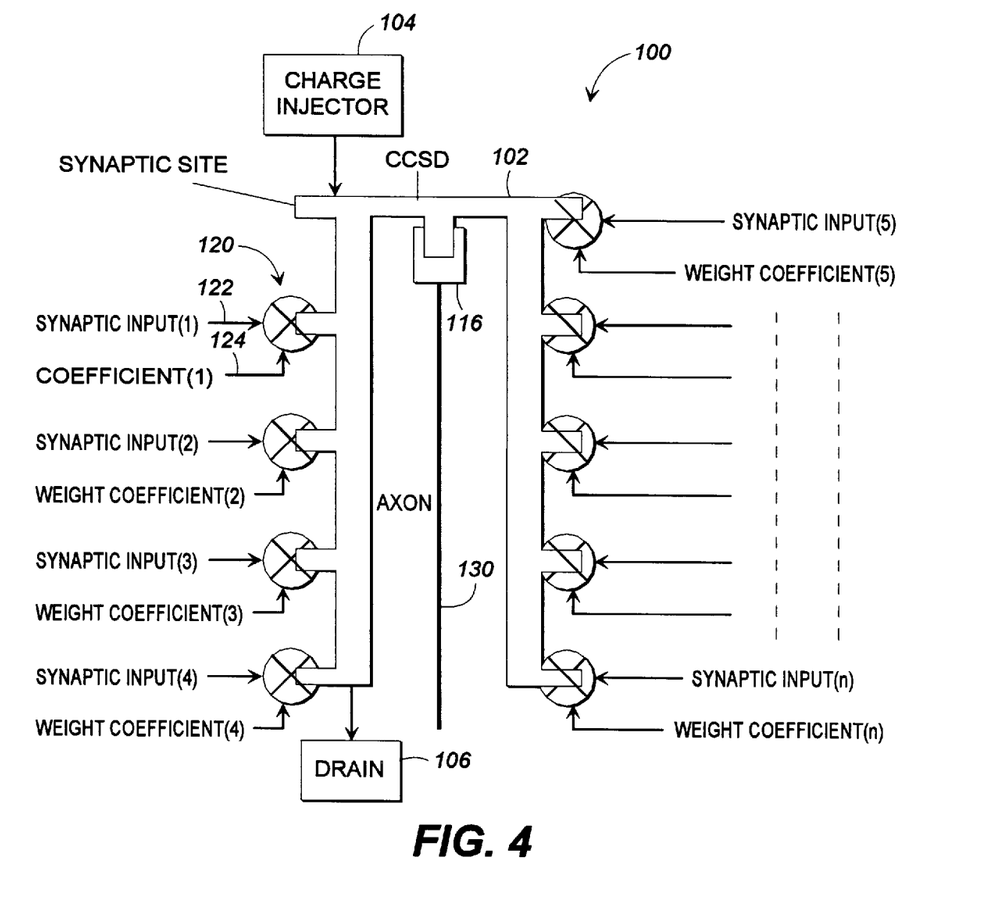
FIG. 4 is a diagram illustrating the principal components of a device constructed in accordance with the preferred embodiment of the present invention.

To illustrate one structural adaptation of the CCSD 102 and a configuration of synaptic inputs, reference is hereby made to FIG. 4. In this illustrated embodiment, the CCSD 102 is U-shaped and includes a plurality of synaptic sites 120. Each synaptic site 120 includes an input 122 and a weighting function or weighting coefficient 124. A preferred structure of various inputs 122 will be described in FIGS. 5A, 5B, and 5C. Suffice it to say that, for purposes of the inventive concepts disclosed herein, the present invention is not limited to a particular input device or structure. Also illustrated is the charge sensor 116, which is used to generate the output signal that is delivered via output 130.

Each of the various inputs 122 are derived either from system inputs, or from outputs of neighboring devices 100 (See processing elements 20 of FIG. 2). As previously mentioned, and as is generally known, the weighting function associated with a given input 122 alters the effect of that input 122. In this regard, a given weighting function may nullify a given input, by weighting it with a value of zero. Furthermore, the various weighting functions may be varied over time, as the device 100 is trained (e.g., simulated learning).

In operation, charge is delivered from the charge injector 104 to the CCSD 102. If all weighting functions/coefficients 124 are set to zero, such that no input is effective upon the CCSD 102, then the charge carried on the CCSD 102 will evenly distribute itself throughout the surface of the CCSD 102. However, as various inputs 122 are imparted (as electric fields) upon local areas of the CCSD 102, they will redistribute the charge in that local area, which will affect the overall distribution of charge. Thus, although the overall quantity of charge carried on the CCSD 102 may be constant, various changes in the inputs 122 and input weighting coefficients will affect the output, as sensed by sensor 116 and delivered to output (axon) 130.

Figure 5A:
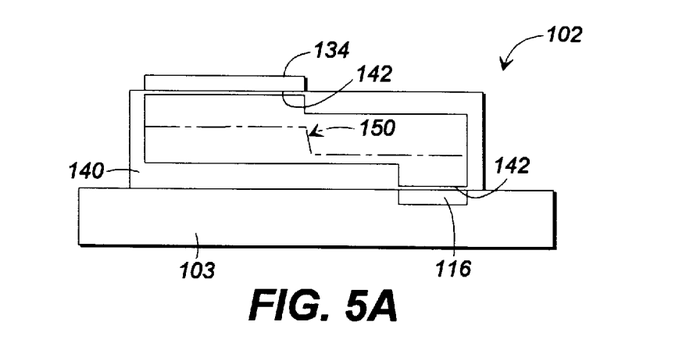
FIG. 5A is a diagram illustrating an input device (synapse) implemented in the form of an overlying control electrode, and a charge sensor, and their disposition in relation to the charge carrying structure, in accordance with one embodiment of the present invention.
Figure 5B:
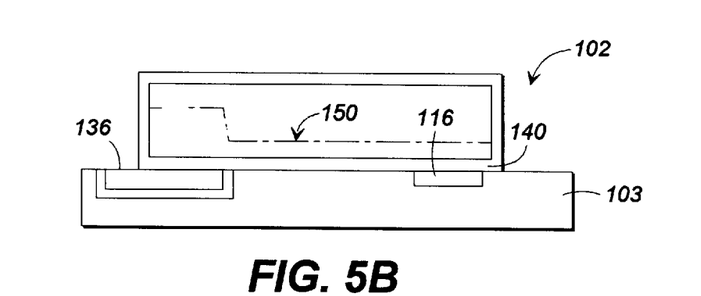
FIG. 5B is a diagram similar to FIG. 5A, but illustrating the input device implemented in the form of a buried electrode.
Figure 5C:
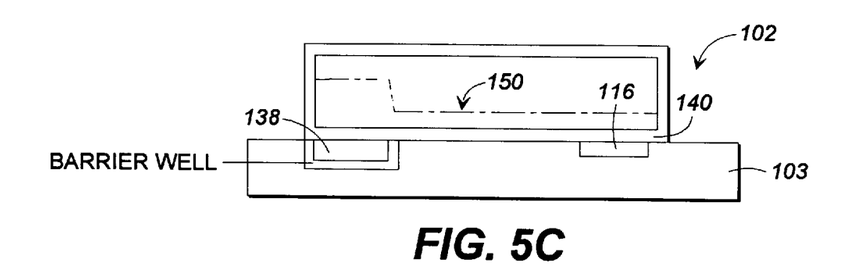
FIG. 5C is a diagram similar to FIG. 5B, but illustrating the input device implemented in the form of a CCD register.

To illustrate the structure of a few particular input devices, reference is made to FIGS. 5A, 5B, and 5C. Briefly, FIG. 5A illustrates an input structure in the form of a control electrode 134, that overlies (in relation to the substrate 103) the CCSD 102. FIG. 5B illustrates an input structure in the form of a buried electrode 136, that underlies the CCSD 120. Finally, FIG. 5C illustrates an input structure in the form of a CCD register 138. For purposes of the present invention, any of the foregoing input device structures, as well as other structures may be utilized with equal success. The various structures are shown merely for purposes of illustration and it may be found that one is preferred over another, depending upon the particular application, or structure of the device 100 selected.

To more particularly describe the operation of the various input device structures, the entire surface area of the CCSD 102 is preferably separated from the substrate 103 and the rest of the circuitry by an insulating barrier 140 (not specifically shown in total, but localized portions shown in other figures). Over most of the surface this barrier 140 is relatively thick and impermeable to charge (e.g. field oxide). However, in a number of locations the barrier 140 is thinner and forms the basis for synaptic junctions. These thin areas are also known as gate oxide regions (e.g.. 142). The thin regions located above the CCSD are used to separate the CCSD from conductive electrodes 134 located on top of the CCSD 102, and thin barriers located below the CCSD 102 allow interaction with a sub layered CCD register 138. It will be appreciated that, in some devices, it may be necessary or desirable to incorporate a small number of very thin insulation areas (e.g. tunneling oxide) to facilitate electron injection and tunneling.

Electric potentials applied to the electrodes 134, 136, 138 control the energy profile 150 in the CCSD 102 in the vicinity of the synaptic sites 120. When the residual electric charge is present in the CCSD 102 the synaptic energy profile effects the distribution of charge inside it. As is shown in FIGS. 5A, 5B, and 5C, the energy level (as reflected by the energy profile 150) in the CCSD 102 immediately above or below the control electrode 134, 136, 138 is effected by the controlled application of electric potential to the control gate. This changed energy potential reflects a redistribution in the electric charge at that local area of the CCSD 102.

The charge density in the predefined (common drain) area of the CCSD 102 is controls by the means of a FET current flow into a CCD based charge pump (See FIG. 9, and more fully discussed in connection with FIG. 8), which operates to generate a train of pulses that can be used to control phase shifts of signals propagating along CCD registers which are delivering presynaptic potentials to distinct neurons. By this means an accurate control of signal delay and as the result auto and cross correlation can be easily achieved in the neural network.

As previously mentioned, the CCSD 102 may preferably be fabricated from polysilicon. Although charge will tend to evenly distribute itself throughout the CCSD 102, a poor conductor like polysilicon will allow the storage or concentration of charge locally within it's volume as a function of local applied electric fields. While the overall charge in the CCSD 102 is constant, the concentration of charge in localized areas may be controllably varied in response to electric fields applied at the various synaptic sites by the various input devices. The storage of charge in this way is essentially permanent, insofar as it will remain in a localized area until the applied field is altered. As illustrated in FIGS. 5A, 5B, and 5C, a number of different mechanisms/structures can be implemented to achieve the local biasing and charge distribution within the CCSD 102.

Referring again to FIG. 4, the main body of the CCSD 102 is a common drain area, and the total charge accumulated represents the sum of multiple weighted input signals 122, 124. The mechanism for this diffusion/drift controlled charge accumulation relies on both input and modulation of that input. The input potential may be supplied by a CCD register 138, coupled electrode 134, 136, or some other means. The CCSD 102 together with a charge sensor 116 and a plurality of capacitatively coupled electrodes and/or CCD lines will act as a summing device. There are many different ways to implement the required biasing. FIGS. 5B and 5C depict two ways to provide input from below the CCSD: by way of a buried electrode 136 (FIG. 5B) or by way of a CCD register 138 (FIG. 5C). Input can also be introduced via a superficial electrode 134 (FIG. 5A).

Figure 6:
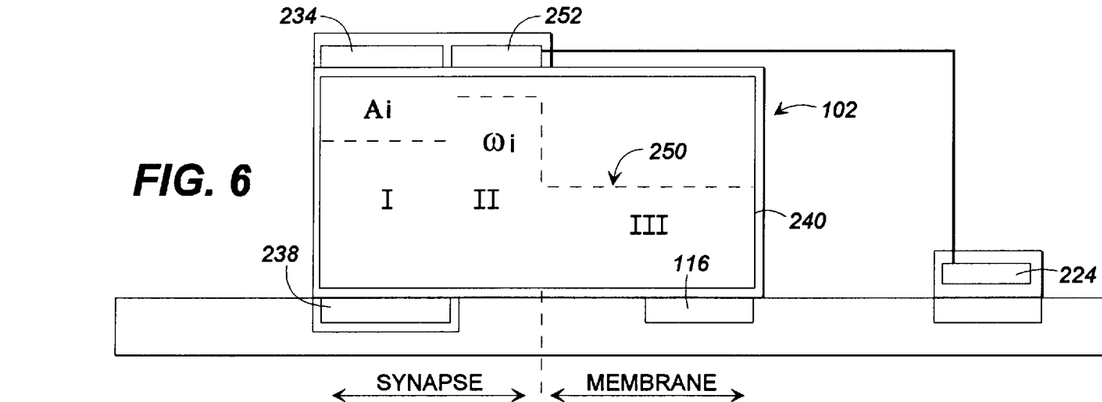
FIG. 6 is a diagram that illustrates the structure and operation of a synaptic site, in accordance with a preferred embodiment of the present invention.

Reference is now made to FIG. 6, which illustrates how a weighting function may be applied to a synaptic site or local area of the CCSD 102. The illustrated structure is similar to the structure of FIG. 5A, 5B, or 5C. Specifically, FIG. 6 illustrates how the energy profile 250 may be modulated or given a 'weight coefficient' by a separately applied potential via, for example, another electrode 252. It will be understood that the 'weight coefficient' may be supplied by way of a storage element 224, which corresponds to the weighting coefficients 124 (See FIG. 4).

By way of example, consider the case in which electrons are the majority charge carriers. FIG. 6 presents a simplified cross-section of a local area (synaptic site) of the CCSD 102 capable of performing some low-level processing (a synapse). The input electrode 234 and/or electrode 238 controls the energy profile in section I of the multiple source area. The synaptic weight electrode 252 modulates the profile in section II (or multiple gate areas). The energy level in section III (the common drain) is common throughout most of the CCSD 102.

An input electrode 234 or CCD 238 can elevate the electron energy level in section I. If no weight potential is applied, the charge diffuses (or drifts) into section II, and then on to section III. If, however, a weight potential is applied to storage element 224, and thus electrode 252, then the energy profile is elevated in section II and the transfer of charge to section III is controlled and is dependent on the relative applied potential values.

Application of the weight potential can be via a nonvolatile semiconductor memory element 224. This element 224 could be, for example, a charge trapping device or a floating structure device and can be used as a node to implement a long-term memory function for storing synaptic weight coefficients. Sections I and II of the energy profile 250 are equivalent to the structure of one excitatory synapse and Section III closely mimics the behavior of a neuron cell membrane. Section I is equivalent to an excitatory synaptic junction were neurotransmission occurs, Section II is a synaptic weight control node, and Section III is a summing node, which collects electrons dumped from all synapses of the CCSD 102. The effect that each individual synapse contributes to the overall neuron activity is given by:

$$S = A_i \omega_i$$

Where $A_i$ is the synaptic input (e.g., voltage) of the ith synaptic site, and $\omega_i$ is the ith weighting coefficient. Thus, the contribution of n synapses is given by the sum of contributions of each-individual synapse, or:

$$S_{total} = \Sigma_i A_i \omega_i \text{ (for i=1 to n)}$$

Figure 7:
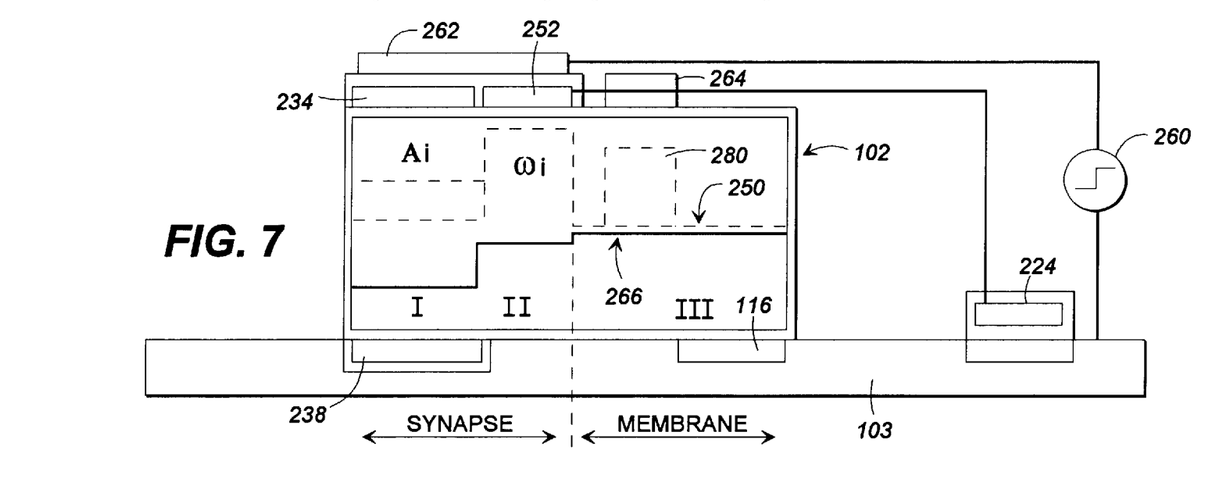
FIG. 7 is a diagram similar to FIG. 6, but further illustrating a reset feature of an embodiment of the present invention.

Reference is now made to FIG. 7, which shows a more detailed structure including a means for resetting the charge distribution. Having discussed the basic structure and operation in connection with FIG. 6, such discussion will not be repeated here. Suffice it to say that the operation, with the exception of the added components is similar to that discussed in connection with FIG. 6. However, the added components include a means for generating a reset pulse 260, and a reset electrode 262. The reset electrode overlies the input electrode 234 and the weight electrode 252, which overly sections I and II respectively. Depletion of electrons in section I will occur as the result of prolonged operation, and electron transfer from section I to section III will degrade. This operation is similar to the behavior in the biological systems known as neuron hyperpolarization.

The structure presented in FIG. 5 is designed to perform the function equivalent of an excitatory synapse. The synaptic weight storage element 224 stores positive charge which is unique to that particular synapse or synaptic site 120 (See FIG. 4). As should be appreciated, the value is adjustable. A relatively high positive voltage can be periodically applied to the reset electrode 262 when a state of synaptic depletion is reached. This resets the energy profile 250 and allows redistribution of charge and continuity of the device performance. In this regard, the energy profile 250 shown in dashed line is representative of an energy profile just prior to the reset, while the energy profile 266 is representative of an energy profile just after the reset.

An inhibitory synaptic function can be added to an individual excitatory synapse or synaptic site 120, or alternatively to a plurality of synaptic sites 120. Thus, an inhibitory synapse is used to inhibit the action of either a single or multiple synapses on the neuron. To achieve this, an inhibitory electrode 264 may be provided. Specifically, the inhibitory electrode 264, along with the underlying semiconductor material can be considered as an artificial inhibitory synapse. In operation, an electric potential applied to the inhibitory electrode 264 causes the energy level in the area 280 of the CCSD 102 immediately underlying the inhibitory electrode 164 to rise. This serves to inhibit the flow of charge from sections I and II through section III, and thus inhibits the operation of the particular synaptic site.

Figure 8:
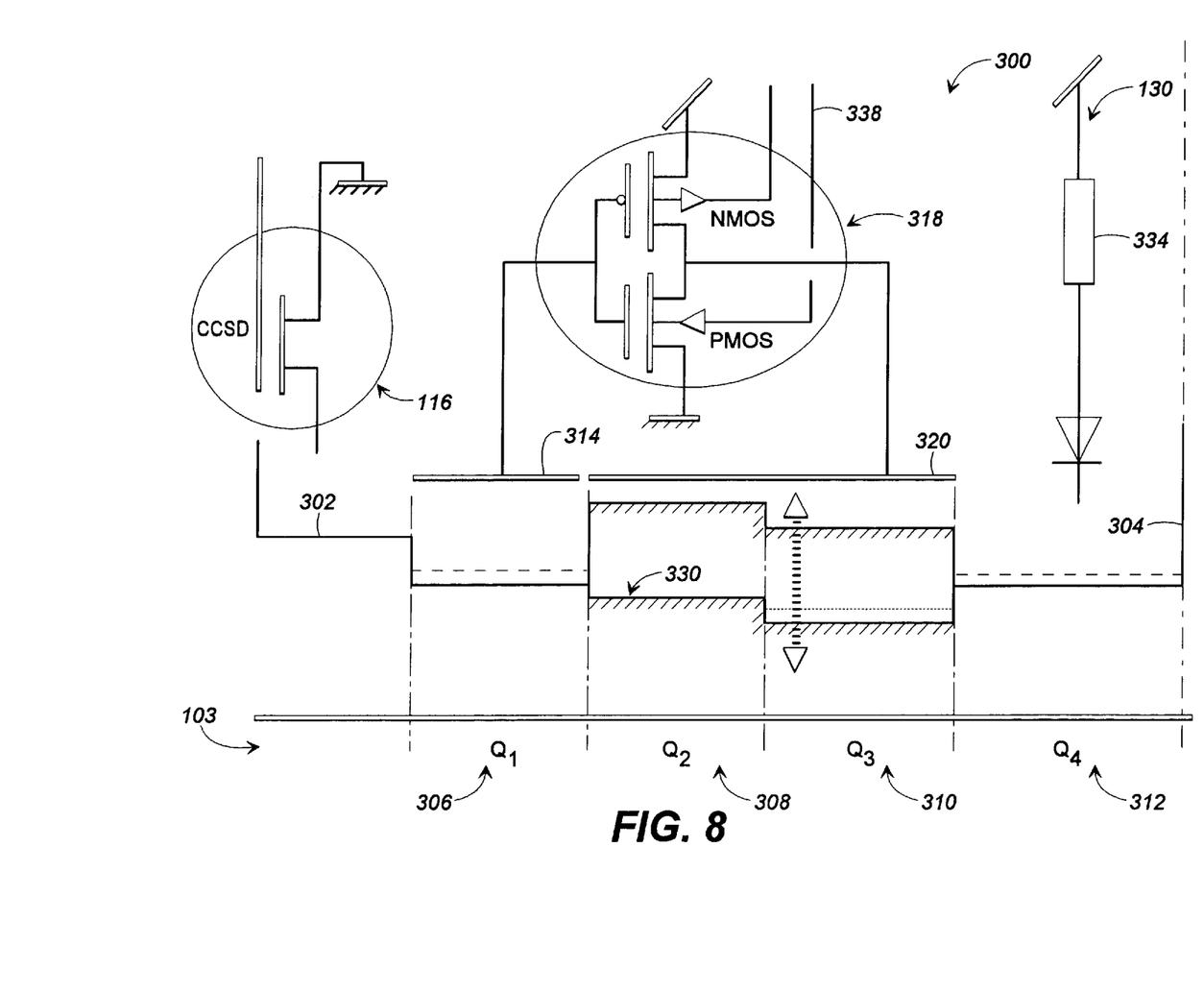
FIG. 8 is a diagram illustrating a voltage controlled oscillator, implemented in the output portion of an embodiment of the present invention.
Figure 9:
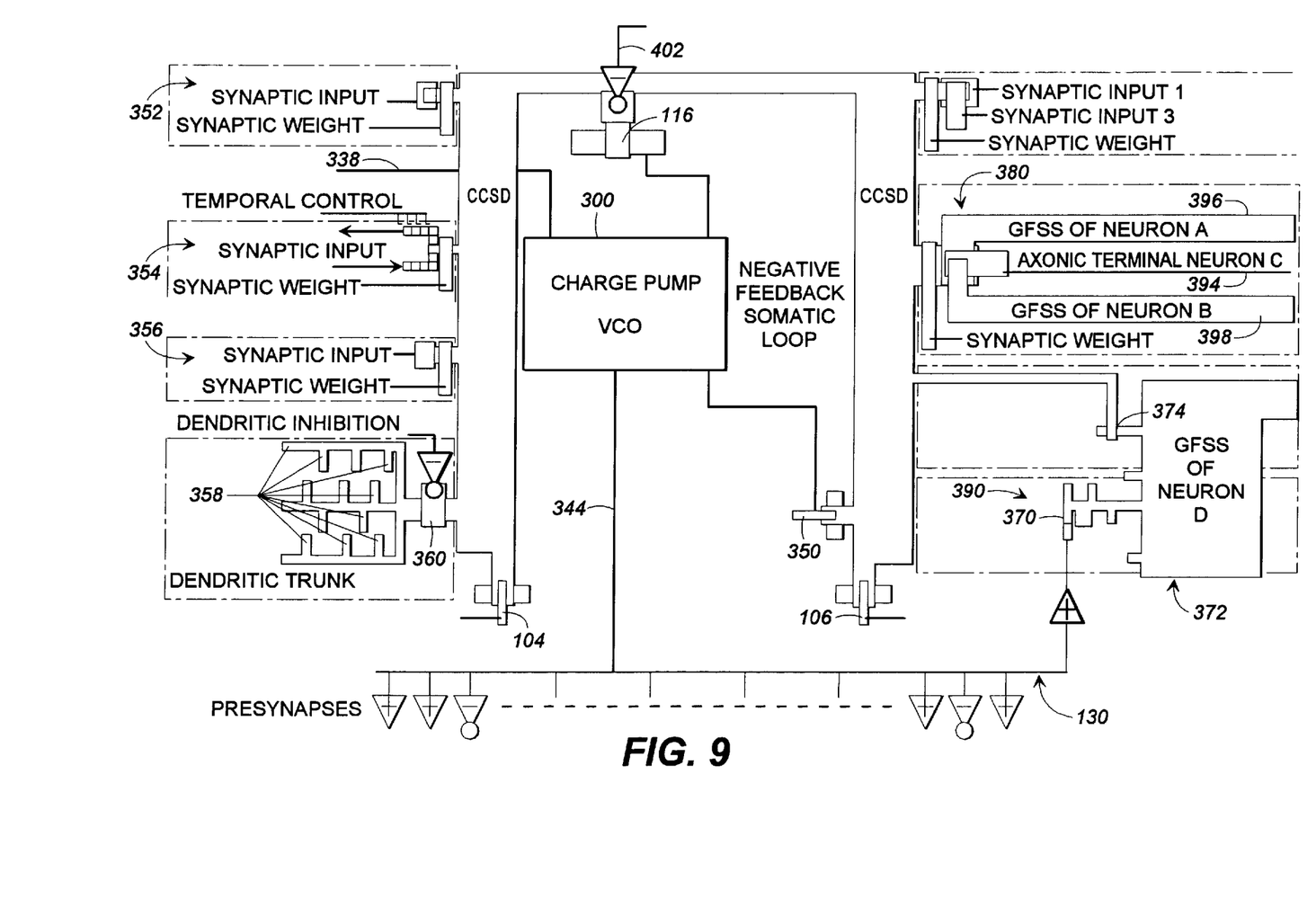
FIG. 9 is a diagram illustrating a more complete embodiment and interconnection of a number of input devices and neighboring processing elements (simulated neurons), in accordance with the teachings of the invention.

Having described the overall operation of the invention, through the injection and drainage of the overall charge in a CCSD 102, and through the controlled manipulation of charge in a CCSD 102 through the use of one or more input devices, reference is now made to FIG. 8, which shows the structure of a unique charge pump 300, or voltage controlled oscillator, that is utilized to generate a sequence of pulses that are delivered to the output. Brief reference to FIG. 9 shows the disposition of the charge pump 300 with respect to the CCSD 102 of the preferred embodiment. As will be described below, the charge pump 300, provides an efficient and novel way of generating an oscillatory output having a frequency that varies in response to the magnitude of the input voltage.

In short, the charge pump includes input means for receiving an input signal 302, output means for outputting an oscillatory signal 304, a plurality of adjacently-disposed CCD charge wells 306, 308, 310, and 312, wherein a first charge well 306 is disposed in communication with the input means and a last charge well 312 is disposed in communication with the output means. Charge sensing means 314 is provided for sensing a magnitude of charge stored in the first charge well 306, and charge transfer means 318, responsive to the charge sensing means 314, are provided for controllably and intermittently transferring charge from the first charge well 306 to the last charge well 312. The predefined energy profile of charge wells 308 and 310 may be defined and controlled by appropriate ion implantation.

The Charge Pump along with a negative feedback loop and an output means (axon) make up the artificial or simulated somatic mechanism (or cell body). In accordance with the preferred embodiment of the present invention, the charge pump 300 consists of a FET charge sensor 116, a CCD structure 306, 308, 310, 312 with proper impurity profile, and a CMOS clock driver 318. The CMOS clock driver 318 incorporates separate substrate biasing capability for both the NMOS and PMOS components. In the illustrated embodiment, the CMOS clock driver 318 is interposed between the charge sensing means 314 and a clock electrode 320. The clock electrode 320 overlies CCD charge wells 308 and 310, and potential applied to the clock electrode controllably varies the energy level with charge wells 308 and 310. If the energy level of these CCD charge wells 308 and 310 is lower than the charge/energy level of charge well 306, then charge from charge well 306 will pass through charge well 308 and into charge well 310.

The action of a plurality of synapses causes charge to accumulate in the common drain area of the CCSD 102. This area acts as the FET gate which controls the current through the FET charge sensor 116. Under normal operating conditions the FET is used only in its sub-threshold range, where its current-voltage characteristic is approximately linear. The current through the charge sensing FET 116 injects charge into the CCD structure 306. The charge flows/diffuses into in a CCD well 306, which has a predefined capacitance. When charge in this well reaches a predetermined threshold limit the CMOS clock driver 318 is activated and charge wells 308 and 310 have a potential applied to them via the clock electrode 320, which lowers the energy of the wells and allows the charge to pass to the second charge well 308, and then the third charge well 310.

As the charge in charge well 306 is depleted and reaches a predetermined lower level the clock electrode 320 applies the appropriate potential and the energy profile 330 returns to its original level (note that the energy profile 330 in charge wells 308 and 310 is illustrated at two different levels, by a vertical displacement). The charge now passes to the fourth charge well 312, where it forms the output current pulse through a resistor 334, or forms a charge packet for further shifting via a CCD structure (not shown). It is appreciated, although not expressly illustrated) that the last charge well 312 is coupled to the output 130, so as to pass charge from well 312 to the output. In this regard, the first charge well 306 is filled, then the energy level in charge wells 308 and 310 is lowered (via clock electrode 320), causing charge from charge well 306 to move into wells 308 and 310. This can also be viewed as passing a charge 'packet' through the CCD structure 306, 308, 310, and 312.

As should be appreciated, the choice of the predetermined levels of charge in the various charge wells 308 and 310 also dictates the characteristics of the output. For example, the output can take the form of a weak current pulse with a short pulse-to-pulse delay or a strong current pulse with a long pulse-to-pulse delay. This can be achieved by choosing appropriate biasing levels for the clock driver 318. Such biasing may be implemented through threshold control signal lines 338.

Within the charge pump 300 there is a need to implement a mechanism by which discrete levels of charge within the first charge well 306 will activate the clock driver 318. A hysteresis is achieved by introducing a period when both NMOS and PMOS components of the CMOS clock driver 318 are closed. This causes a high impedance state at the clock driver 318 output which in turn ensures the potential is retained on the clock electrode 320. This hysteresis is important to ensure most of the charge in the first charge well 306 is transferred to the second charge well 308. The hysteresis also prevents the output having a high frequency oscillation.

It should be further appreciated that, the greater the quantity/concentration of charge sensed by the charge sensor 116, the charge sensor 116 introduces charge to charge well 306 at a higher rate. Thus, charge well 306 fills at a faster rate, and sensing means 314 causes the driver 318 and clock electrode 320 to control the energy level in charge wells 308 and 310 to allow the charge (or a charge packet) to pass from well 306 through wells 308 and 310 more quickly. Thus, it can be seen that as the magnitude or concentration of charge sensed by sensor 116 increases, the frequency of pulses delivered to the output 130 increases. In this way, the charge pump 300 can also be viewed as a voltage controlled oscillator.

As previously mentioned, the means of conveying the output (Axon) can be via an extended CCD register or some conductive structure. In either case the timing of the pulses is determined by how fast charge well 306 fills up, which is in turn determined by the charge accumulated in the common drain area of the CCSD 102. This is the major parameter that controls the temporal behavior of the simulated neuron. In addition, pulse generation is modulated by choosing appropriate biasing levels for the clock driver 318, by way of threshold control lines 338. Pulses generated by the charge pump can be supplied to the inhibitory and/or excitatory inputs of synapses of another silicon neuron, and can control charge buildup in the CCSD 102 of an associated neuron.

The foregoing describes the operation of a simulated neuron in its active state. However, most of the time the neuron is at rest. Nevertheless, even when the neuron is in a resting state, there is some background activity. As the CCSD charge sensor FET 116 works in its sub-threshold region, a small but finite current flows and so charge accumulates in charge well 306. The accumulation is very slow, so the charge pump 300 will fire pulses with a low repetition rate. Under certain conditions, for example when the activity of the surrounding neurons is undesirably high, the entire neural network may become 'overexcited' and seize. To prevent this from happening, a special negative feedback somatic loop 350 (FIG. 9) is introduced. If all the excitory synapses of the neuron are functioning simultaneously, the neuron can become overexcited and the VCO could start firing at far greater rate than in the normal active state. This may occur if the charge in the CCSD 102 is so great that the CCSD charge sensor FET 116 no longer operates in its sub-threshold region, but actually turns ON and allows significant current to flow, giving a rush of charge into the first charge well 306. Such over-excitation may be prevented by triggering a drain from the CCSD 102 via local negative feedback loop, as the FET approaches its ON state. This ensures the CCSD 102 charge level is reduced to a value at which normal operation is again resumed.

Figure 10:
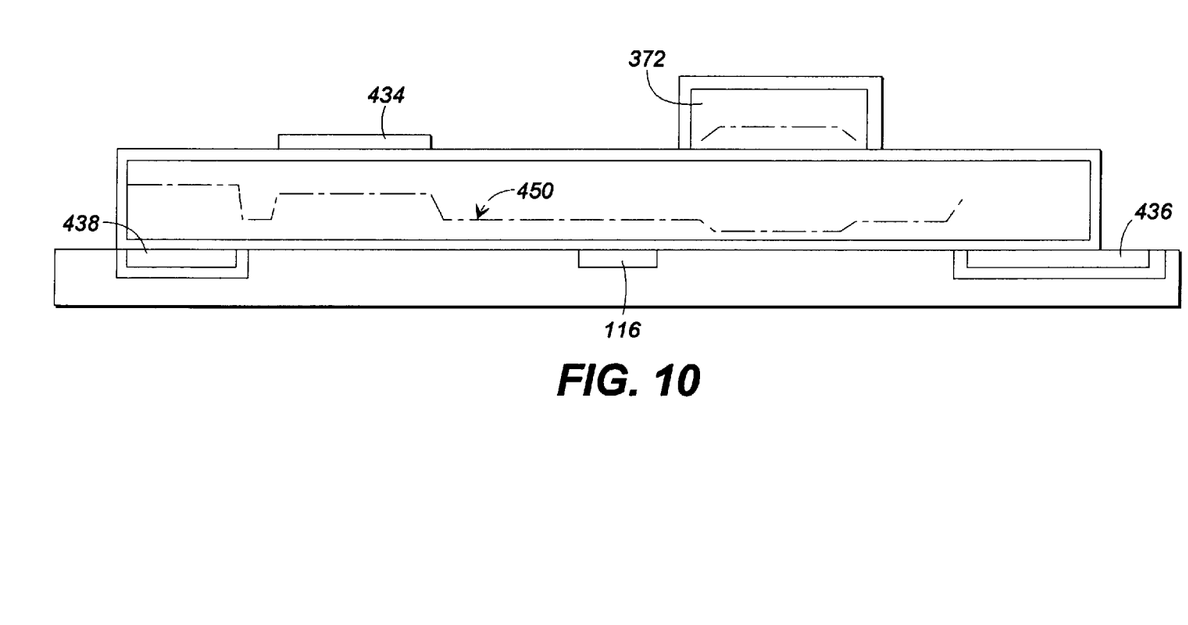
FIG. 10 is a diagram illustrating the implementation of the present invention in a multi-layer artificial neural network system.

Having described the structure and operation of the individual components that make up the CCSD of the preferred embodiment, reference is made briefly to FIG. 9 which shows only one of many possible configurations of a CCSD 102 constructed in accordance with the concepts and teachings of the present invention. Indeed, as is seen in reference to FIG. 9, the configuration of a CCSD 102 may be quite unique. It may include input devices 352, 354, 356 having differing structures, examples of which were illustrated in FIGS. 5A, 5B, and 5C. One or more synaptic sites 358 may comprise a plurality of individual inputs, as is depicted by the dendritic trunk 358. The effect of this site may, however, be inhibited by an inhibitory electrode 360, much like that disclosed in connection with FIG. 7. The output 130 will preferably be connected to an input 370 of one or more other CCSDs, such as CCSD 372. In fact the output 374 of such other CCSD 372 may be fed back as an input of CCSD 102 (reciprocal dendrodentritic snapse). The reciprocal dendo-dendritic synapse reflects the understanding that in biological systems a single synapse rarely occurs in isolation. Instead, it is usually one of a number of synapses that together make up a larger pattern of interconnecting synapses. In a biological system, reciprocal synapses are virtually always formed as two synaptic dendrodendritic connections between two neurons. However, in the case of the artificial neuron of the illustrated embodiment, the dendrodendritic synapse is reciprocal as a result of the synergetic effect of stored charge within two neurons. FIG. 10, illustrates this type of connection and shows a possible energy profile for such a connection.

Specifically, it is seen that the energy profile 450 is affected in the regions that are directly over or under (in proximity) an exterior source of electric potential. For example, the CCD register 438, the control electrode 343, the buried electrode 436, and the neighboring CCSD 372 each effect the energy profile 450. It can be appreciated from FIG. 10, that multiple CCSDs may be fabricated in multi-layer fashion.

In keeping with the description of FIG. 9, the axodendritic synapse 390, unlike the dendrodendritic synapse which is reciprocal in character, are directional. Within these synapses the axon delivers a potential as opposed to the dendrites which simply possess a charge distribution which affects the charge distribution of another dendrite when a synaptic connection is made. The later is an electrostatic interaction which is by its very nature is reciprocal. In Type 6 synapse the output of the prime neuron is the input of another Neuron 372.

Another variation of this could be the prime neuron output being directed as input to a dendrite of the prime itself. Accordingly, a multiple synaptic connection site 380 is illustrated. Here, the axon of neuron C 394 synapses with the dendrites of neuron A 396 and Neuron B 398. In this multiple synapse, neuron A 396 has a further dendrodenritic synapse with the prime neuron described.

The foregoing types of synapse are basic examples of possible configurations of which many more permutations exist.

FIG. 9 also illustrates the other principal parts of the CCSD 102 artificial silicon neuron. The main function of the axon 130 is the fast delivery of the firing activity of the neuron to a presynaptic membrane in a distinct location. The presynaptic membrane is a termination of the axon 130 that delivers the firing activity of a neuron to many different synapses. The different general types of synaptic connections have been described above. The following are more specific in their action: axon Hillock inhibition 402 is an inhibitory synapse which can inhibit the charge in the CCSD 102 from reaching the charge sensor 116 by creating an energy barrier between the CCSD 102 and the charge sensor 116. Dendritic inhibition is also facilitated by an inhibitory synapse 360, which can inhibit the influence of the action of the entire dendrite on the CCSD 102.

It is possible to fabricate the relatively complex synaptic connections described here using standard techniques and known materials. This silicon neuron can replace an array of standard logic gates containing many thousands of transistors. Furthermore, the ability of the above to have diverse types of interconnections with similar units is the bases for building, in hardware, a highly efficient artificial neural network. Such a system would replicate the biological neural network to a degree as yet unobtainable using standard processing and digital logic, or software. The advantages of building a system using a network composed of the devices described above is that the memory storage and processing functions are effectively in the same unit and require no busing or interface. In effect, all the advantages inherent to neural networks can be realized by building a system of the type disclosed. The overall capability of this type of system built from these devices provides far greater complexity and control than is currently available. The analogue processing, interconnectability, and real parallel processing capability makes the system ideal in for example artificial intelligence applications.

The foregoing description has been presented for purposes of illustration and description. It is not intended to be exhaustive or to limit the invention to the precise forms disclosed. Obvious modifications or variations are possible in light of the above teachings. For example, FIG. 9 illustrates how a variety of synaptic sites may be configured on a single CCSD 102. It further illustrates the multiple CCSD 102 may be interrelated or interconnected. It will, however, be appreciated that the various structures for implementing the concepts and teachings of the present invention are virtually endless, and may strongly depend upon the application.

The embodiment or embodiments discussed were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly and legally entitled.

What is claimed is:

1. An apparatus for simulating the behavior of a biological neuron comprising:
   a charge-carrying component fabricated from semiconductive material, the charge-carrying component being substantially surrounded by an isolating material, wherein the substantial isolation of the component helps ensure the preservation of electrical charge on the charge-carrying component;
   a charge injector disposed adjacent to the charge-carrying component and configured to controllably transfer charge to the charge-carrying component;
   a drain disposed adjacent to the charge-carrying component and configured to controllably transfer charge away from the charge-carrying component;
   a charge sensor disposed in proximity with a charge sensing location on the charge-carrying component; and
   an output in communication with the charge sensor, the output carrying an electric signal that is responsive of the charge sensed by the charge sensor.

2. The apparatus as defined in claim 1, further including a voltage-controlled oscillator electrically disposed between the charge sensor and the output, the voltage-controlled oscillator configured to output a train of electric signal pulses at the output, the train of electrical signal pulses being proportional in frequency to the magnitude of charge sensed by the charge sensor.

3. The apparatus as defined in claim 1, wherein the isolating material is silicon dioxide ($SiO_2$).

4. The apparatus as defined in claim 1, wherein the isolating material is silicon nitride $Si_3N_4$.

5. The apparatus as defined in claim 1, further including at least one input device, the at least one input device configured to induce an electric field at a local area of the charge-carrying component, the electric field operative to redistribute charge on the charge-carrying component.

6. The apparatus as defined in claim 5, wherein the input device includes a control electrode disposed in close proximity to the local area.

7. The apparatus as defined in claim 6, wherein the control electrode is fabricated from metal.

8. The apparatus as defined in claim 6, wherein the control electrode is fabricated from heavily doped polysilicon.

9. The apparatus as defined in claim 6, wherein the control electrode separated from the charge-carrying component by a gate oxide having a defined thickness.

10. The apparatus as defined in claim 9, wherein the magnitude of the electric field induced at the local area is controlled by the thickness of the gate oxide and the potential of the control electrode.

11. The apparatus as defined in claim 5, wherein the input device includes a buried electrode.

12. The apparatus as defined in claim 5, wherein the input device includes a charge coupled device (CCD) register.

13. The apparatus as defined in claim 5, further including a plurality of input devices, each configured to induce an electric field at a local area of the charge-carrying component.

14. The apparatus as defined in claim 13, further including a weighting means associated with each of the input devices for weighting the intensity of the electric field a induced by each of the input devices.

15. The apparatus as defined in claim 1, wherein the drain includes a transistor disposed in close proximity to the charge-carrying component.

16. The apparatus as defined in claim 15, wherein the drain further includes a control gate disposed in proximity to the transistor and configured to control the operation of the transistor, wherein potential controllably applied to the control gate operates to transfer charge away from the charge carrying component by tunneling charge through a thin tunneling oxide portion of the isolating material.

17. The apparatus as defined in claim 1, wherein the charge injector includes a transistor disposed in close proximity to the charge-carrying component.

18. The apparatus as defined in claim 17, wherein the charge injector further includes a control gate disposed in proximity to the transistor and configured to control the operation of the transistor, wherein potential controllably applied to the control gate operates to transfer charge to the charge carrying component by tunneling charge through a thin tunneling oxide portion of the isolating material.

19. The apparatus as defined in claim 1, wherein the charge sensor includes a transistor that is biased by charge accumulated at the charge sensing location.

20. The apparatus as defined in claim 1, wherein the charge-carrying component is fabricated from polysilicon.

21. An apparatus for simulating the behavior of a biological neuron comprising:
   semiconductor means for carrying electric charge, the semiconductor means being disposed within an isolating material, wherein electric charge on the semiconductor means is substantially preserved without leakage;

means for injecting charge to the semiconductor means in a controlled manner;

means for draining charge from the semiconductor means in a controlled fashion;

means for sensing charge intensity at a charge sensing location on the semiconductor means; and means responsive to the means for sensing charge for outputting an electric signal that is indicative of the charge at the charge sensing location.

22. The apparatus as defined in claim 21, wherein the means for outputting includes means for formatting the electric signal into a train of pulses having a frequency that is proportional to the magnitude of charge sensed by the means for sensing charge.

23. The apparatus as defined in claim 22, wherein the means for formatting includes a voltage controlled oscillator.

24. The apparatus as defined in claim 23, wherein the voltage controlled oscillator includes an input in communication with the means for sensing charge.

25. The apparatus as defined in claim 24, wherein the voltage controlled oscillator further includes a multi-charge-well doped CCD structure, wherein a first charge well is in communication with the means for sensing charge, and a last charge well is in communication with an output driver.

26. The apparatus as defined in claim 25, further including feedback means, extending between the last charge well and the first charge well, for controlling the transfer of charge through the CCD structure from the first charge well to the last charge well.

27. The apparatus as defined in claim 21, further including means for controlling the means for injecting charge, the means for controlling operating to determine both the magnitude and rate of charge injected to the means for carrying charge.

28. The apparatus as defined in claim 21, further including means for controlling the means for draining charge, the means for controlling operating to determine both the magnitude and rate of charge drained from the means for carrying charge.

29. An apparatus for simulating the behavior of a biological neuron comprising:

a charge-carrying structure surrounded by an isolating material that is operative to substantially preserve the quantity of charge presently on the charge-carrying structure;

a charge injector configured to inject charge to the charge-carrying structure;

a charge drain configured to drain charge away from the charge-carrying structure;

a plurality of synaptic sites disposed in proximity to the charge carrying structure, each synaptic site including means for imparting an electric field on a synaptic site location of the charge carrying structure to alter the charge distribution thereon, each synaptic site further including weighting means for varying the magnitude of the electric field imparted by the means for imparting;

a charge sensor disposed in proximity to a charge sensing location on the charge-carrying structure; and output means, responsive to the charge sensor, for outputting an electric signal indicative of the magnitude of charge at the charge sensing location.

30. The apparatus as defined in claim 29, wherein the output means includes means for formatting the electric signal into a train of pulses having a frequency that is proportional to the magnitude of charge sensed by the means for sensing charge.

31. The apparatus as defined in claim 30, wherein the means for formatting includes a voltage controlled oscillator.

32. The apparatus as defined in claim 31, wherein the voltage controlled oscillator includes an input in communication with the charge sensor.

33. The apparatus as defined in claim 32, wherein the voltage controlled oscillator further includes a multi-stage CCD structure, wherein a first stage is in communication with the charge sensor, and a last charge well is in communication with an output driver.

34. The apparatus as defined in claim 33, further including feedback means, extending between the last state and the first stage, for controlling the transfer of charge through the CCD structure from the first stage to the last stage.

* * * * *